(12) United States Patent
Chen et al.

(10) Patent No.: US 7,571,421 B2
(45) Date of Patent: Aug. 4, 2009

(54) SYSTEM, METHOD, AND COMPUTER-READABLE MEDIUM FOR PERFORMING DATA PREPARATION FOR A MASK DESIGN

(75) Inventors: Peng-Ren Chen, Sindian (TW); Chien-Chao Huang, Hsin-Chu (TW); Chih-Chiang Tu, Tauyen (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 137 days.

(21) Appl. No.: 11/738,844

(22) Filed: Apr. 23, 2007

(65) Prior Publication Data
US 2008/0263501 A1 Oct. 23, 2008

(51) Int. Cl.
*G06F 17/50* (2006.01)
(52) U.S. Cl. .......................................... 716/19; 716/21
(58) Field of Classification Search ....................... None
See application file for complete search history.

(56) References Cited

U.S. PATENT DOCUMENTS

| | | | | |
|---|---|---|---|---|
| 7,024,655 B2* | 4/2006 | Cobb | ........................... | 716/19 |
| 7,318,214 B1* | 1/2008 | Prasad et al. | .................. | 716/21 |
| 7,418,693 B1* | 8/2008 | Gennari et al. | ................ | 716/19 |
| 2006/0228041 A1* | 10/2006 | Joshi | .......................... | 382/260 |
| 2008/0189673 A1* | 8/2008 | Ying | ........................... | 716/21 |

* cited by examiner

*Primary Examiner*—Leigh Marie Garbowski
(74) *Attorney, Agent, or Firm*—Haynes and Boone, LLP

(57) ABSTRACT

A method, computer-readable medium, and system for performing data preparation are provided. An integrated circuit design is received, and a plurality of pre-optical proximity correction processes are invoked such that the plurality of pre-optical proximity correction processes are performed in parallel. An optical proximity correction process is invoked in response to a determination that each of the plurality of pre-optical proximity correction processes have completed. A post-optical proximity correction process is invoked in response to a determination that the optical proximity correction process has completed.

17 Claims, 5 Drawing Sheets

SYSTEM, METHOD, AND COMPUTER-READABLE MEDIUM FOR PERFORMING DATA PREPARATION FOR A MASK DESIGN

BACKGROUND

Semiconductor integrated circuits wafers are produced by a plurality of processes in a wafer fabrication facility (fab). These processes, and associated fabrication tools, may include thermal oxidation, diffusion, ion implantation, rapid thermal processing (RTP), chemical vapor deposition (CVD), physical vapor deposition (PVD), epitaxy, etch, and photolithography. For some products, the semiconductor wafer may pass through up to 600 process steps.

For photolithography and other patterning processes, data preparation and mask/wafer design are significant parts of the integrated circuit (IC) manufacturing process. Mask/wafer design conventionally involves numerous design and evaluation processes performed in a sequential manner. For example, various processes are required prior to provide optical proximity correction (OPC) for the wafer design process. Numerous other post-OPC processes are then performed. Upon invocation of the mask/wafer design process, sequential processes must await completion of a previous process before the next process may be invoked. Upon supply of an initial mask/wafer design, the overall mask/wafer design process may typically consume over three days processing time.

BRIEF DESCRIPTION OF THE DRAWINGS

Aspects of the present disclosure are best understood from the following detailed description when read with the accompanying figures.

DETAILED DESCRIPTION

Figure 1:
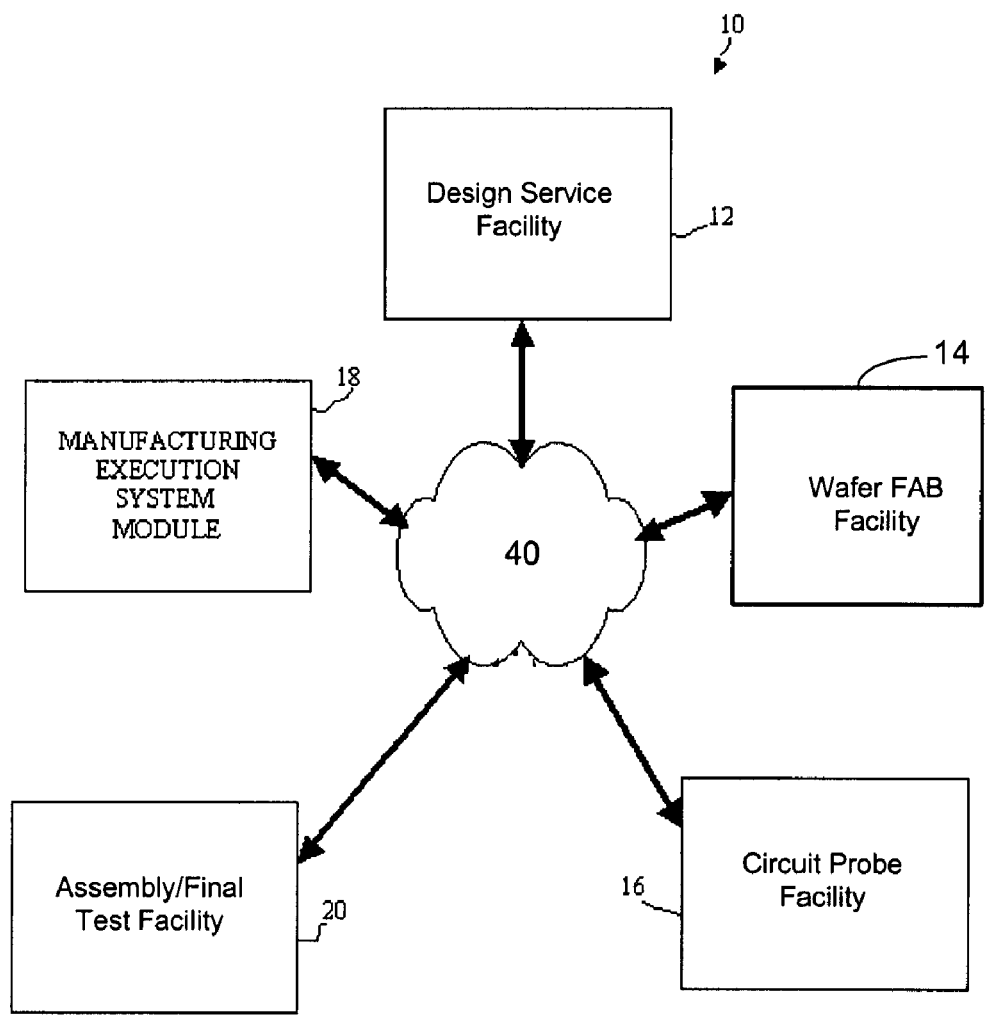
FIG. 1 is a simplified block diagram of an embodiment of a semiconductor manufacturing system in which embodiments disclosed herein may be implemented for data preparation processes performed during mask design.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Heretofore, no mechanism has been provided to significantly alter the mask design process from a sequential processing system in a manner that advantageously reduces the mask design process.

FIG. 1 is a simplified block diagram of an embodiment of a semiconductor manufacturing system 10 in which embodiments disclosed herein may be implemented for mask design. FIG. 1 is intended as an example, and not as an architectural limitation of embodiments described herein.

System 10 may be used in the design, development and manufacturing cycle and services related thereto in a semiconductor manufacturing cycle. System 10 may include a plurality of production or service entities including a design service facility 12 comprising, for example, a design house, design facility, or other production or service entity adapted to provide design services related to IC production. System 10 may include a wafer fab facility 14 that comprises a semiconductor wafer processing facility. System 10 also may include a circuit probe facility 16. A manufacturing execution system module 18 may be deployed in system 10 to monitor and control wafer lots among various fabrication tools and automated systems. An assembly/final test facility 20 may be included in system 10 and comprises a facility that may assemble and/or test one or more products.

All system facilities may communicate electronically with one another via a network 40 which may be a global network such as the World Wide Web and the Internet or another suitable data exchange mechanism. Preferably, each facility 12-20 comprises a web service interface component that is operable to convert data in diverse formats into one or more web service message formats for transmission across network 40 to one or more other facilities using one or more transport protocols. Facilities 12-20 may be commonly or individually operated, and one or more of the facilities 12-20 may be co-located at a common locale. In other implementations, one of more of facilities 12-20 may be disposed at geographically diverse locations. FIG. 1 is intended as an example, and not as an architectural limitation, of embodiments described herein, and system 10 may be implemented without some depicted facilities, with other facilities substituted for one or more of those shown, or with additional facilities not shown. The particular facilities shown in system 10 are depicted for illustrative purposes to facilitate an understanding of the embodiments disclosed herein.

Figure 2:
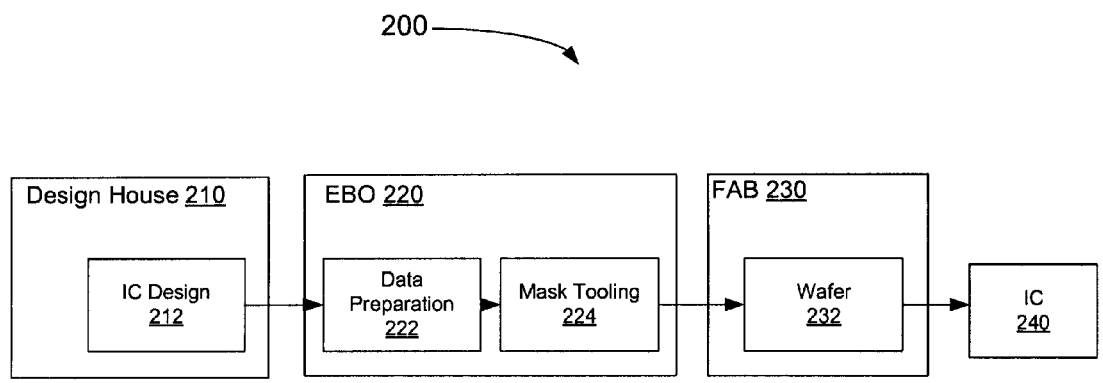
FIG. 2 is a diagrammatic representation of the role of data preparation in IC manufacture.

FIG. 2 is a diagrammatic representation of the role of data preparation 200 in IC manufacture. An IC design 212 may be developed at a suitable design house 210, e.g., design service facility 12 of system 10 depicted in FIG. 1. IC design 212 provides a circuit specification for a particular application. On completion of IC design 212, IC design 212 is provided to an electron beam operation facility 220. Data preparation processes 222 may then be invoked for various quality assurance processes, customization of the IC design for the capability of the IC production facility, and various other processes. Data preparation processes 222 comprise a plurality of processes that have conventionally been performed in a sequential manner. On completion of data preparation processes 222, a processed mask design is provided to mask tooling facilities 224 for generation of a mask. The mask may then be conveyed to a wafer fab facility, e.g., wafer fab facility 14 depicted in system 10 of FIG. 1, for production of the IC.

As advances in lithography continue to shrink feature dimensions below the wavelength used to manufacture the features, corrections for distortions resulting from the projection optics becomes a more critical part of data preparation during the mask design process. Optical proximity correction may include line-end treatment, line biasing, and scattering bars (SB). As is known, because equal width lines image differently at different pitches, and lines isolated proximity-wise from other lines or features image differently than lines proximate other lines or features, line biasing may be used to compensate for line geometries on the reticle. Additionally, scattering bars comprise sub-resolution features that may be included in a mask proximate isolated lines that result in enhancements to the imaged line.

Figure 3:
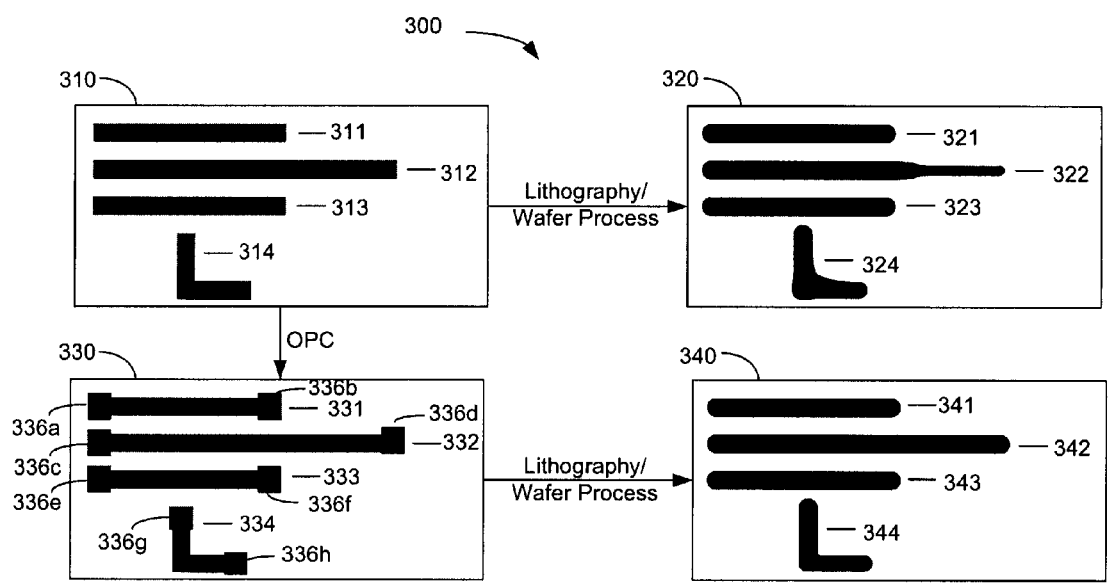
FIG. 3 is a diagrammatic representation depicting a contrast between wafer structures produced without OPC and similar structures produced with OPC.

FIG. 3 is a diagrammatic representation depicting a contrast 300 between wafer structures produced without OPC and similar structures produced with OPC. A mask design 310 may include various features 311-314 such as lines, dummy structures, or other features. Mask design 310 may be subjected to lithography and wafer processes without OPC resulting in wafer structures 320 comprising various features 321-324. Undesirable optical proximity effects result during the lithography and wafer processes resulting in various anomalies, such as line end shortening and corner rounding, as depicted by wafer structure 320.

To alleviate the optical proximity effects, mask design 310 may be subjected to OPC procedures to produce a modified OPC mask pattern 330. For example, features 331-334 respectively corresponding to features 311-314 may be modified with optical proximity correction features 336a-336h such as serifs, hammerheads, or other elements. The modified OPC mask pattern 330 may then be subjected to lithography and wafer processes resulting in wafer structures 340 comprising various features 341-344. Optical proximity correction features 336a-336h result in a reduction or elimination of the optical proximity effects as depicted by wafer structures 340.

Figure 4:
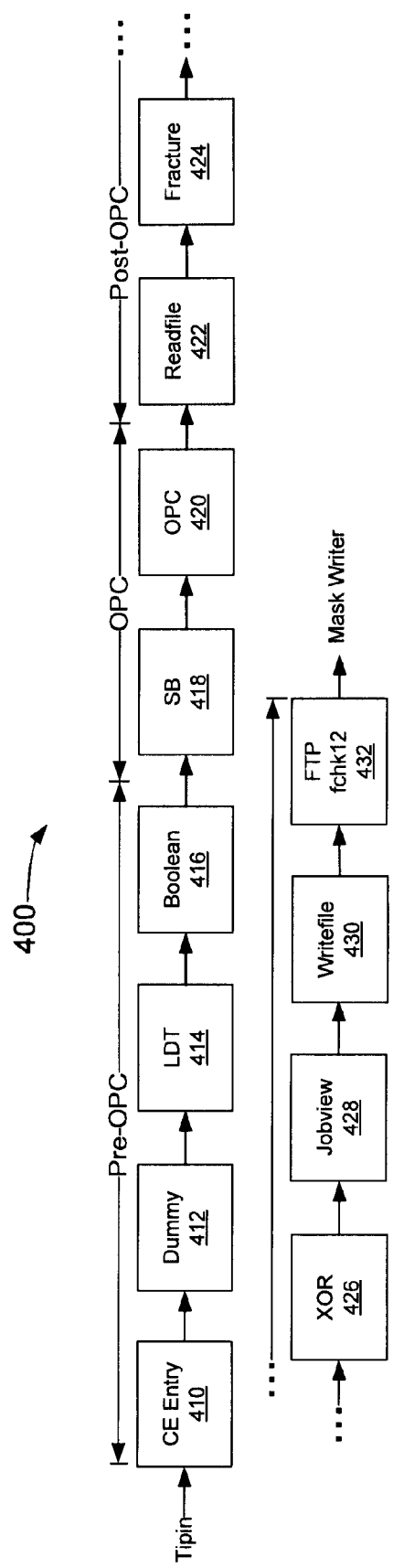
FIG. 4 is a diagrammatic representation of an exemplary data preparation routine that may be performed during wafer design.

As noted above, various pre-OPC processes and post-OPC processes are performed during data preparation stages of wafer design. FIG. 4 is a diagrammatic representation of an exemplary data preparation routine 400 that may be performed during wafer design. The data preparation process may be initiated at tape-in (or tipin), e.g., on supply of a GDS-II IC design from a design house. A customer engineer (CE) entry stage 410 may first be performed during the data preparation routine 400. The customer engineer entry stage 410 may, for example, include specification of the number of layers, mask naming, and the like. Upon completion of CE entry stage 410, a dummy stage 412 may be performed during which dummy structures are specified for the IC design. Upon completion of the dummy stage 412, a load database tape (LDT) stage 414 may be performed. The load database tape stage may comprise a quality control stage to evaluate a tape-out document. After completion of the LDT stage 414, a Boolean stage 416 may then be performed. Boolean stage 416 includes design retuning based on the wafer manufacturing capabilities of the fab to be used for the wafer production. OPC processes, such as a scatter bar stage 418 and other OPC stage(s) 420, may be performed after completion of Boolean stage 416.

Post OPC stages may then be sequentially run after completion of the OPC stages. For example, a readfile stage 422 may be performed on the current mask design, and a fracture stage 424 may then be performed on the mask design read during readfile stage 422. The fracture stage 424 fractures the design features into polygons or other structures suitable for mask production. On completion of the fracture stage 424, an XOR stage 426 may be performed for quality assurance purposes. The XOR stage 426 compares a file, e.g., with OPC correction effect, with a file, e.g., without OPC correction effect, to evaluate if there is any unexpected or incorrect OPC result. A jobview stage 428 may then be performed, which includes a customer review of one or more of the data preparation results. A writefile stage 430 may be subsequently performed followed by a transfer stage 432, e.g., by file transport protocol, of the processed design to a mask writer.

Figure 5:
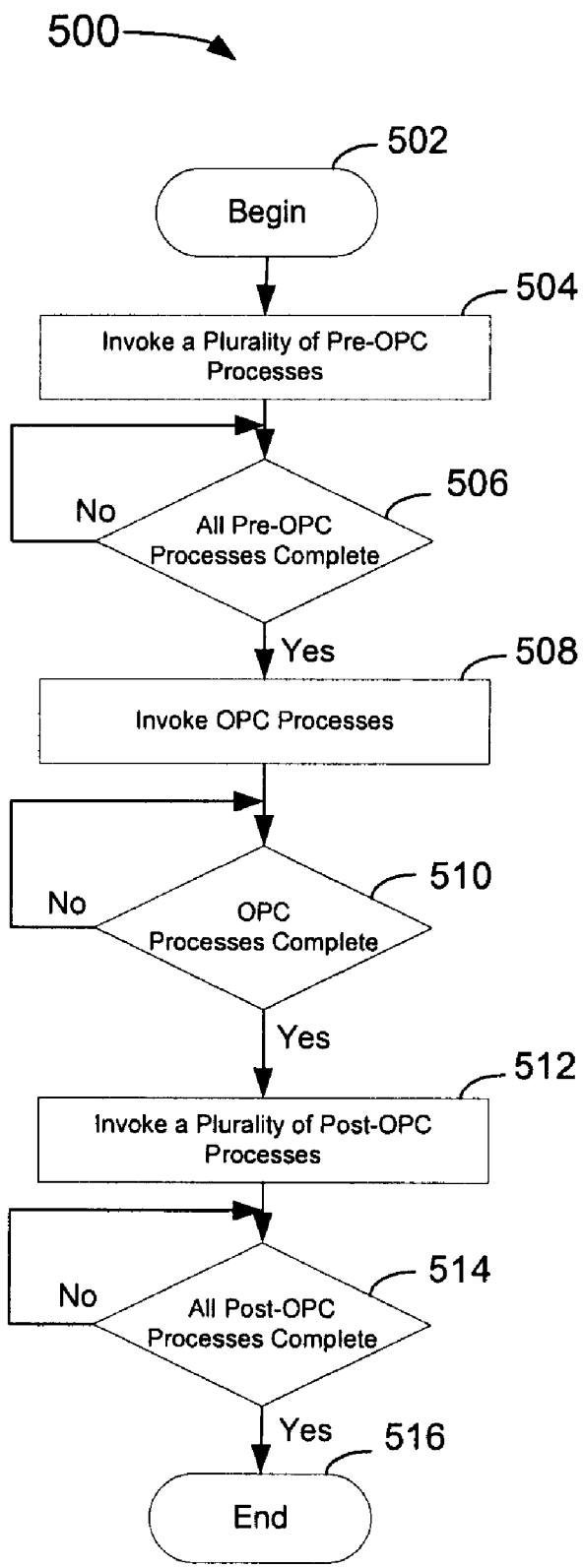
FIG. 5 is a flowchart depicting a general mask design process routine implemented in accordance with an embodiment.

In accordance with an embodiment, various pre-OPC processes and/or post-OPC processes may be performed in parallel to advantageously reduce the data preparation duration during mask design data preparation. FIG. 5 is a flowchart 500 depicting a general mask design process routine implemented in accordance with one embodiment of the present invention. The mask design process routine is invoked (step 502), e.g., on supply of a mask/wafer design specification to a design facility. In accordance with one embodiment, on receipt of the design specification, a plurality of pre-OPC processes are invoked (step 504), and the invoked pre-OPC processes proceed in parallel. An evaluation may be periodically made to determine if all invoked pre-OPC processes have completed (step 506). In the event that any pre-OPC processes have yet to complete, the mask design process routine may continue to await completion of all pre-OPC processes.

On a determination that all invoked pre-OPC processes have completed, the routine then proceeds to invoke the OPC processes (step 508). An evaluation may then periodically be made to determine if the OPC processes have completed (step 510). On determination that the OPC processes have completed, a plurality of post-OPC processes are invoked (step 512), and the invoked post-OPC processes proceed in parallel. An evaluation may be periodically made to determine if all invoked post-OPC processes have completed (step 514). In the event that any post-OPC processes have yet to complete, the mask design process routine may continue to wait for completion of all the post-OPC processes. Upon a determination that all post-OPC processes have completed, the design process routine cycle completes (step 516), and the completed design is transmitted to a mask writer.

Figure 6:
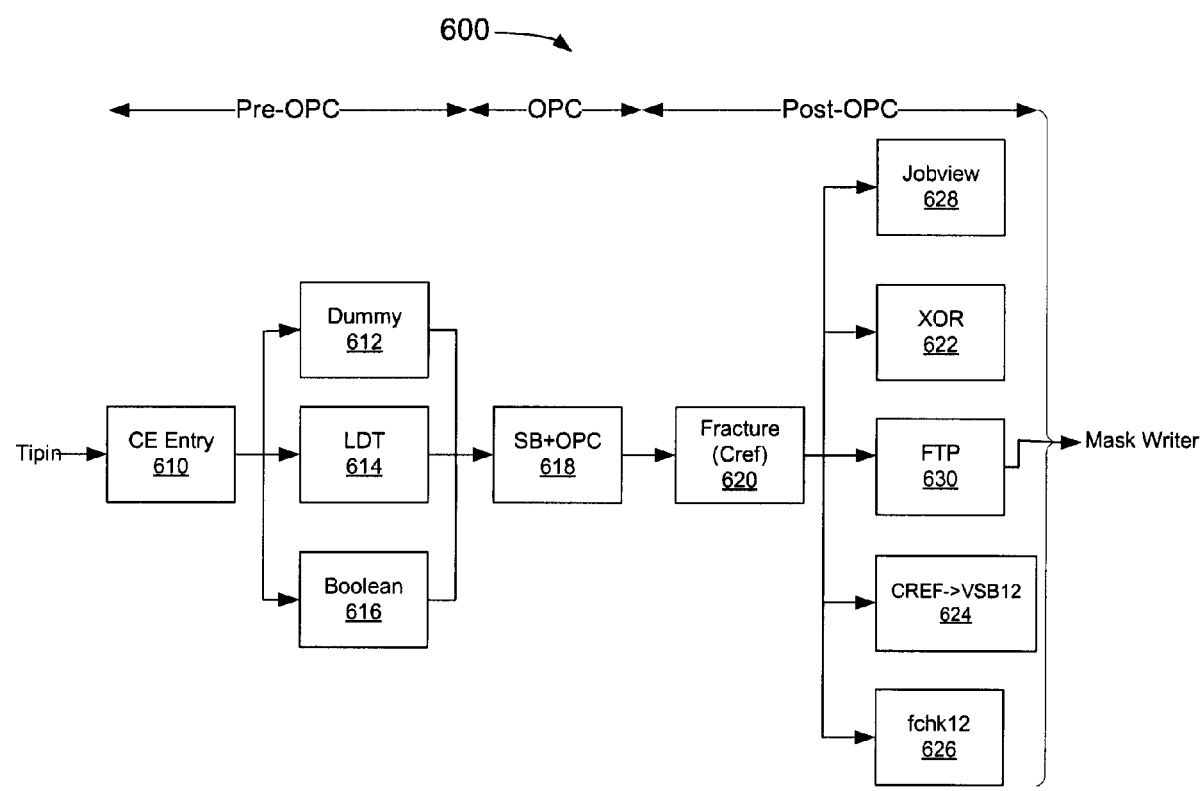
FIG. 6 is a diagrammatic representation of an exemplary data preparation routine that may be performed during wafer design during which various pre-OPC and post-OPC stages may be performed in parallel in accordance with an embodiment.

FIG. 6 is a diagrammatic representation of an exemplary data preparation routine 600 that may be performed during wafer design during which various pre-OPC and post-OPC stages may be performed in parallel in accordance with one embodiment of the present invention. The data preparation process may be initiated at tape-in. A CE entry stage 610 may first be performed during the data preparation routine 600. The customer engineer entry stage 610 may, for example, include specification of the number of layers, mask naming, and the like. Upon completion of CE entry stage 610, a plurality of pre-OPC stages may be performed in parallel. In the exemplary embodiment, a dummy stage 612, an LDT stage 614, and a Boolean stage 616 may be processed in parallel.

On completion of dummy stage 612, LDT stage 614, and Boolean stage 616, a scatter bar and OPC processing stage 618 is performed during which scatter bars are added and/or other OPC processing is performed in parallel. Upon completion of the scatter bar and OPC processing stage 618, a fracture stage 620 is performed on the mask design. On completion of the fracture stage 620, a plurality of post-OPC stages are performed in parallel. For example, an XOR stage 622, a Cref to VSB12 stage 624, an fchk12 stage 626, a jobview stage 628, and a transfer stage 630 may be performed, at least in part, in parallel. Upon completion of post-OPC stages 622-630, data preparation routine 600 may complete by output of the mask design to a mask writer.

As described, mechanisms for performing data preparation for a mask design are provided. A plurality of pre-OPC processes or stages may be invoked and performed in parallel. OPC processes are invoked on completion of the pre-OPC stages. On completion of the OPC processes, a plurality of post-OPC processes or stages may be invoked and performed in parallel. Advantageously, the time required for performing data preparation associated with a mask design is reduced with respect to conventional mechanisms in which data preparation stages are performed sequentially.

The illustrative block diagrams and flowcharts depict process steps or blocks that may represent modules, segments, portions of code, or other routines that include one or more executable instructions for implementing specific logical functions or steps in the process. Although the particular examples illustrate specific process steps or procedures, many alternative implementations are possible and may be made by simple design choice. Some process steps may be executed in different order from the specific description herein based on, for example, considerations of function, purpose, conformance to standard, legacy structure, user interface design, and the like.

Aspects of the embodiments disclosed herein may be implemented in software, hardware, firmware, or a combination thereof. The various elements of the system, either individually or in combination, may be implemented as a computer program product tangibly embodied in a machine-readable storage device for execution by a processing unit. Various steps of embodiments may be performed by a computer processor executing a program tangibly embodied on a computer-readable medium to perform functions by operating on input and generating output. The computer-readable medium may be, for example, a memory, a transportable medium such as a compact disk, a floppy disk, or a diskette, such that a computer program embodying the aspects of the present invention can be loaded onto a computer. The computer program is not limited to any particular embodiment, and may, for example, be implemented in an operating system, application program, foreground or background process, driver, network stack, or any combination thereof, executing on a single computer processor or multiple computer processors. Additionally, various steps of embodiments of the invention may provide one or more data structures generated, produced, received, or otherwise implemented on a computer-readable medium, such as a memory.

Although embodiments of the present disclosure have been described in detail, those skilled in the art should understand that they may make various changes, substitutions and alterations herein without departing from the spirit and scope of the present disclosure.

We claim:

1. A method of performing data preparation during a mask design process, comprising:
   receiving an integrated circuit design;
   invoking a plurality of pre-optical proximity correction processes in a computer such that the plurality of pre-optical proximity correction processes are performed in parallel; wherein invoking a plurality of pre-optical proximity correction processes comprises invoking a plurality of processes selected from the group consisting of a dummy stage, a load database tape stage, and a Boolean stage;
   invoking an optical proximity correction process in response to a determination that each of the plurality of pre-optical proximity correction processes have completed;
   invoking a post-optical proximity correction process in response to a determination that the optical proximity correction process has completed; and
   providing the integrated circuit design to which pre-optical proximity correction, optical proximity correction, and post-optical proximity correction has been completed, to a mask writer.

2. The method of claim 1, wherein invoking an optical proximity correction process comprises invoking a scatter bar stage.

3. The method of claim 1, wherein invoking a post-optical proximity correction process further comprises invoking a plurality of post-optical proximity correction processes.

4. The method of claim 3, wherein invoking a plurality of post-optical proximity correction processes comprises invoking a plurality of processes selected from the group consisting of an XOR stage, a writefile stage, and a file transfer stage.

5. The method of claim 1, wherein providing the integrated circuit design to a mask writer includes outputting a mask specification in response to a determination that the post-optical proximity correct process has completed.

6. The method of claim 5, wherein outputting a mask specification comprises transferring the mask specification to the mask writer.

7. A computer-readable medium having computer-executable instructions for execution by a processing system, the computer-executable instructions for performing a data preparation routine, comprising:
   instructions that receive an integrated circuit design;
   instructions that invoke a plurality of pre-optical proximity correction processes such that the plurality of pre-optical proximity correction processes are performed in parallel, wherein the instructions that invoke a plurality of pre-optical proximity correction processes comprise instructions that invoke a plurality of processes selected from the group consisting of a dummy stage, a load database tape stage, and a Boolean stage;
   instructions that invoke an optical proximity correction process in response to a determination that each of the plurality of pre-optical proximity correction processes have completed; and
   instructions that invoke a post-optical proximity correction process in response to a determination that the optical proximity correction process has completed.

8. The computer-readable medium of claim 7, wherein the instructions that invoke an optical proximity correction process comprise instructions that invoke a scatter bar stage.

9. The computer-readable medium of claim 7, wherein the instructions that invoke a post-optical proximity correction process further comprise instructions that invoke a plurality of post-optical proximity correction processes.

10. The computer-readable medium of claim 9, wherein the instructions that invoke a plurality of post-optical proximity correction processes comprise instructions that invoke a plurality of processes selected from the group consisting of an XOR stage, a writefile stage, and a file transfer stage.

11. The computer-readable medium of claim 7, further comprising instructions that output a mask specification in response to a determination that the post-optical proximity correct process has completed.

12. The computer-readable medium of claim 11, wherein the instructions that output a mask specification comprise instructions that transfer the mask specification to a mask writer.

13. A system for performing data preparation, comprising:
a design service facility for receiving an integrated circuit design, invoke a plurality of pre-optical proximity correction processes such that the plurality of pre-optical proximity correction processes are performed in parallel, invoke an optical proximity correction process in response to a determination that each of the plurality of pre-optical proximity correction processes have completed, and invoke a post-optical proximity correction process in response to a determination that the optical proximity correction process has completed, wherein invoking a plurality of pre-optical proximity correction processes comprises invoking a plurality of processes selected from the group consisting of a dummy stage, a load database tape stage, and a Boolean stage; and
a wafer fabrication facility that includes a mask writer.

14. The system of claim 13, wherein invoking an optical proximity correction process comprises invoking a scatter bar stage.

15. The system of claim 13, wherein invoking a post-optical proximity correction process further comprises invoking a plurality of post-optical proximity correction processes.

16. The system of claim 15, wherein invoking a plurality of post-optical proximity correction processes comprises invoking a plurality of processes selected from the group consisting of an XOR stage, a writefile stage, and a file transfer stage.

17. The system of claim 13, further comprising outputting a mask specification in response to a determination that the post-optical proximity correct process has completed, and transferring the mask specification to the mask writer.

* * * * *